Jan. 15, 1963 J. D. HEIBEL ET AL 3,073,881

THERMOELECTRIC CERAMIC

Filed Dec. 6, 1960

INVENTORS
Jerome D Heibel
BY Lyle E Shoot
Ralph Hammar
attorney

United States Patent Office 3,073,881
Patented Jan. 15, 1963

3,073,881

THERMOELECTRIC CERAMIC

Jerome D. Heibel, Erie, and Lyle E. Shoot, State College, Pa., assignors to Erie Resistor Corporation, Erie, Pa., a corporation of Pennsylvania Filed Dec. 6, 1960, Ser. No. 74,132
5 Claims. (Cl. 136—5)

This invention is a thermoelectric ceramic in which the active ingredient is an oxygen deficiency, titanium oxide having the formula $TiO_{2-a}$ where $a$ is a small fraction.

In Patent 2,675,417 it is disclosed that a thermoelectric element can be formed of partially reduced titanium dioxide. The partially reduced titanium dioxide has good thermoelectric output and low internal resistance but it has the disadvantage that it reoxidizes at moderately low temperatures and the reoxidized form is a dielectric which is not useful for thermoelectric purposes. In application Serial No. 660,075, filed May 20, 1957, now Patent No. 3,033,907, it is disclosed that the addition of small quantities of pentavalent ions to $TiO_2$ has a similar kind of effect as oxygen deficiency insofar as the thermoelectric properties are concerned and that the resultant bodies are stable at high temperatures at which the reduced $TiO_2$ would reoxidize. The group V substitution type $TiO_2$ has good thermoelectric output but its resistance is higher than reduced $TiO_2$ by a factor of from 1,000 to 1,000,000. This is true even though the substitution type $TiO_2$ bodies are specially treated in order to freeze in the high temperature state.

By firing the group V substitution type bodies in a reducing atmosphere, bodies are obtained which have the resistance to reoxidation of the substitution type bodies and which have lower resistance than bodies in which the oxygen deficiency is obtained by partial reduction. This greatly increases the utility for thermoelectric purposes.

Figure 1:
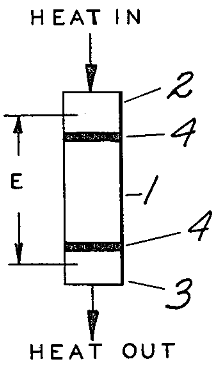
Figure 2:
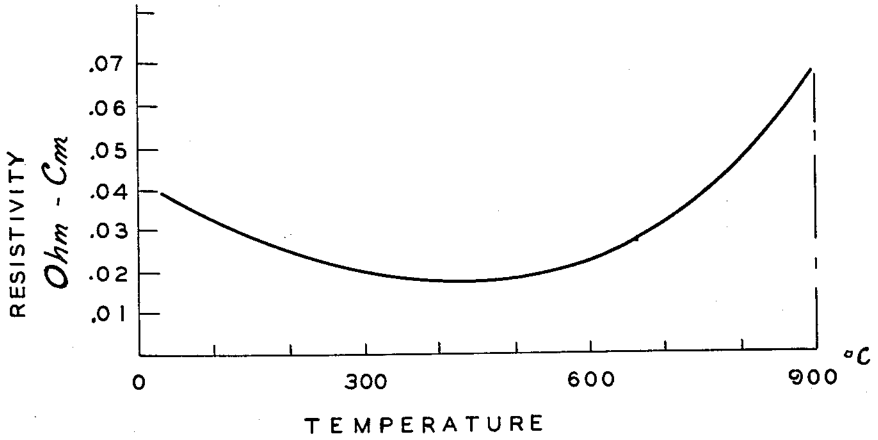

In the drawing, FIG. 1 shows a thermoelectric generator, and FIG. 2 is a resistance temperature curve.

FIG. 1 is a diagrammatic view showing a ceramic thermoelectric element 1 with a hot junction 2 at one end and a cold junction 3 at the opposite end. Heat flows in at the hot junction and out at the cold junction and the output voltage is across the junctions. Good thermal and electrical contact is provided by electrodes 4 on the ends of the ceramic element.

The manufacture of the thermoelectric elements is conveniently carried out in two steps although the two steps may be combined into a single step. In the first step, a ceramic of $TiO_2$ is mixed with a minor percentage (e.g. .25 to 5 mol percent) of oxides of group V elements along with suitable fluxes and binders and is then formed into the desired shape by any of the ceramic techniques. The bodies are then fired in the usual ceramic kilns at the customary temperatures (e.g. 1200° C. to 1500° C.). At the end of this initial step, the resultant ceramic has thermoelectric properties which are stable at high temperatures (up to 900° C. or more) but the resistivity is so high that it interferes with the use of the thermoelectric properties for power purposes. From room temperature up to about 300° C. the resistivity has a negative temperature coefficient as shown in FIG. 1. From 300° to about 600° the resistivity is generally constant and from about 600° up to about 900° the resistivity has a positive temperature coefficient. This is the characteristic resistivity curve for the group V substitution type thermoelectric ceramics. In typical ceramics, the room temperature resistivity might be from several thousand to several million ohm centimeters, and the minimum resistivity might be several hundred ohm centimeters. Except for the ability to withstand high temperatures, the substitution type thermoelectric ceramics are inferior to the types in which the oxygen deficiency is obtained by partial reduction.

In the second step, the substitution type ceramic is refired in a reducing atmosphere such as hydrogen or carbon. When hydrogen is used as the reducing atmosphere, the firing time can be thirty minutes at a temperature of 2100° F. At higher and lower temperatures, shorter and longer times are required. In general, the firing times in the reducing atmosphere are comparable with those required to reduce the oxide $TiO_2$ to the semi-conducting form. The firing in the reducing atmosphere makes a substantial reduction in specific resistivity. Instead of specific resistivities at room temperature measured in thousands of ohms, the room temperature specific resistivity is reduced to hundredths of an ohm. The reduction in specific resistivity at room temperature may be as much as $10^6$. In the single step manufacture, the green ceramic is fired in a reducing atmosphere.

By way of a specific example, for a $TiO_2$ ceramic containing a group V additive such as .5 mol percent $Nb_2O_5$, the room temperature resistivity would be from $4.7\times10^7$ to $9.2\times10^3$ ohm centimeters, the lower value being obtained by quenching from the firing temperature to freeze in the high temperature state.

By merely firing this ceramic in a reducing atmosphere, the room temperature resistivity is reduced to .04 ohm centimeter, the minimum resistivity is reduced to .018 ohm centimeter and the resistivity at 900° C. is reduced to .07 ohm centimeter. The firing in the reducing atmosphere appears to disperse the group V elements more completely throughout the body and to produce the improved characteristics which are most desirable for thermoelectric generation.

By combination of the group V additions and the reduced atmosphere firing, the resistivity is lowered to ½ or ⅓ or even less than the resistivity of the comparable $TiO_{2-a}$ body without any group V addition.

Because of the extremely low resistivity, the contact resistance of the electrodes is of great importance. Ceramic paints which rely upon frits to adhere the metal coatings are not suitable because of the high resistance of the frits. The electrodes should be applied so as to obtain molecular contact with the ceramic, for example by chemical deposition or by gas plating. Where extremely high operating temperatures are not required, chemically deposited nickel is very satisfactory. For higher operating temperatures, chemically deposited palladium is more satisfactory because of its freedom from oxidation.

A typical formula for the thermoelectric element is $TiO_2$ (95 to 99.75 mol percent)$+Y_2O_5$ (5 to .25 mol percent). In this formula, Y is selected from the group consisting of vanadium, niobium, tantalum, arsenic, antimony or bismuth. Other ingredients may be present but are not desired as they dilute the thermoelectric properties. The resultant thermoelectric elements are N type in that the low temperature activity is due to free electrons caused by an oxygen deficiency or by the equivalent conductivity produced by the substitution of group V ions.

The ability to operate at high temperatures makes possible a higher Carnot efficiency with resultant overall increase in system efficiency. Another important advantage for thermoelectric applications is that the reduced bodies with group V additives have decreased thermal conductivity. That is, the reduction in electrical resistance is not accompanied by a reduction in thermal resistance (increase in thermal conductivity). The decreased thermal conductivity cuts down the heat loss which is important in thermoelectric power generation.

What is claimed as new is:

1. A thermoelectric element comprising an N type ceramic body of composition $TiO_2$ (95–99.75 mol percent) $+Y_2O_5$ (5 to .25 mol percent) where Y is selected from the group consisting of vanadium, niobium, tantalum, arsenic, antimony or bismuth, said ceramic being fired in a reducing atmosphere and characterized by low electrical resistance as compared to the same body without firing in a reducing atmosphere, a hot junction on one part of said body, a cold junction on another part of said body spaced from said hot junction, and metallic electrodes in low contact resistance with said junctions.

2. The element of claim 1 in which the electrodes are nickel.

3. The element of claim 1 in which the electrodes are palladium.

4. The element of claim 1 in which Y is Nb.

5. The method of improving the properties of thermoelectric ceramics of composition $TiO_2$ (95–99.75 mol percent) $+Y_2O_5$ (5 to .25 mol percent) where Y is selected from the group consisting of vanadium, niobium, tantalum, arsenic, antimony or bismuth, which comprises firing the same in a reducing atmosphere to produce low electrical resistance as compared to the same body without firing in a reducing atmosphere.

References Cited in the file of this patent

UNITED STATES PATENTS

| | | |
|---|---|---|
| 2,675,417 | Heibel | Apr. 13, 1954 |

FOREIGN PATENTS

| | | |
|---|---|---|
| 577,109 | Great Britain | May 6, 1946 |

OTHER REFERENCES

Johnson et al.: Journal of The American Ceramic Society, vol. 32, 1949, pages 398–401. Copy in Div. 56.